United States Patent [19]

Hsu et al.

[11] Patent Number: 5,383,793
[45] Date of Patent: Jan. 24, 1995

[54] ADJUSTABLE HEIGHT AND POSITION PRINTED CIRCUIT BOARD RETAINER

[75] Inventors: Sawyer C. Hsu; Bao Q. Tran, both of San Diego; Robert T. Wang, Escondido, all of Calif.

[73] Assignee: NCR Corporation, Dayton, Ohio

[21] Appl. No.: 168,293

[22] Filed: Dec. 17, 1993

[51] Int. Cl.⁶ .................................. H01R 13/62
[52] U.S. Cl. ...................... 439/327; 439/59; 361/801; 248/316.4
[58] Field of Search ............ 439/61, 62, 59, 327, 439/328, 55; 248/316.4, 298, 544; 361/785, 825, 801; 211/41, 50

[56] References Cited

U.S. PATENT DOCUMENTS

| | | | |
|---|---|---|---|
| 3,829,741 | 8/1974 | Athey | 317/101 |
| 4,109,300 | 8/1978 | Reiner | 361/801 |
| 4,198,024 | 4/1980 | Cavanna | 248/544 |
| 4,462,499 | 7/1984 | Calabro | 211/41 |
| 4,477,135 | 10/1984 | Pronto | 211/41 |
| 4,509,810 | 4/1985 | Erlam et al. | 339/17 M |
| 4,721,155 | 1/1988 | McNulty | 164/80.2 |
| 4,779,674 | 10/1988 | McNulty | 165/80.2 |
| 4,869,680 | 9/1989 | Yamamoto et al. | 439/327 |
| 4,927,111 | 5/1990 | Takahashi | 248/500 |
| 4,951,176 | 8/1990 | Bergfried et al. | 361/400 |

Primary Examiner—Larry I. Schwartz
Assistant Examiner—Hien D. Vu
Attorney, Agent, or Firm—James M. Stover

[57] ABSTRACT

An adjustable height and position retainer for releasable retaining a printed circuit card in a circuit card edge connector. The retainer includes an elongated base member for attachment to the side of a circuit card edge connector, an elongated retaining post, and a clamp assembly slideably attached to the retaining post and positionable at any selected position along the length of the retaining post. The retaining post is slideably attached to the base member such that the post is secured in an orthogonal relationship with the circuit card edge connector and parallel with a circuit card installed into the edge connector, yet the retaining post is positionable at any selected position along the length of the base member. The clamp assembly includes an extrusion which holds the top edge of a printed circuit card installed into the circuit card edge connector. The circuit card retainer is thus adjustable to retain different sizes of circuit cards and to avoid interference with connectors or components attached to the circuit card.

8 Claims, 4 Drawing Sheets

ADJUSTABLE HEIGHT AND POSITION PRINTED CIRCUIT BOARD RETAINER

The present invention relates to printed circuit boards and more particularly, to an adjustable height and position retainer for accommodating varying sizes of printed circuit boards.

BACKGROUND OF THE INVENTION

Present day digital computer systems typically include hundreds of integrated and discrete components mounted on printed circuit boards (PCBs), the components located on a single printed circuit board being interconnected by wiring or circuits within the printed circuit board. Many computer systems, including most personal computers, include a primary printed circuit board, known as a motherboard, having many of the computer's major components, such as a processor, drive controllers, video controllers, primary memory, interrupt controllers, BIOS and other components, mounted thereon. These printed circuit boards may also include sockets and connectors for receiving additional components, signal cables, component modules, multichip modules and for connection to other printed circuit boards.

Additional optional or required printed circuit boards, often referred to as "daughter" boards typically include electrical contacts along one edge which are press fitted into edge connectors secured to the surface of the motherboard. Alternatively, the printed circuit boards, including the motherboard, may all be connected through edge connectors secured to a common backplane.

Although the printed circuit boards are press fitted into the edge connectors, additional support may be required to secure the boards to prevent the boards from disengaging from their edge connectors as a result of vibration or movement of the system cabinetry. Even a slight, possibly unnoticeable, separation between a board and its corresponding edge connector may cause interruptions in the electrical signal paths between the board and connector. The orientation of the edge connectors and installed printed circuit boards, e.g. vertical, horizontal, or some other orientation, may increase the likelihood of a board separating from its connector. Large boards may further increase the likelihood of a board separating from its connector.

To address the above-described concerns, several styles of circuit card retainers have been devised. One such circuit card retainer is disclosed in U.S. Pat. No. 4,198,024, issued Apr. 15, 1993, to Peter J. Cavanna. The disclosed retainer comprises a unitary retention arm which is rigidly attached proximate a card edge connector. The other end of the retention arm is formed into a L-shaped latch which can be pressed into engagement with a printed circuit card installed into the card edge connector. The retainer arm may also be formed in two sections which permits the length of the arm to be varied for accommodation of boards of varying sizes. However, as shown, the installation and adjustment of the retainer arm is relatively difficult. Furthermore, the flexibility of the retainer arm to accommodate boards of varying sizes or which including components or connectors which interfere with the retainer arm, is limited. Connectors or components on the surface or top edge of the card installed into the connector may prevent the utilization of the retainer.

OBJECTS OF THE INVENTION

It is therefore an object of the present invention to provide a new and useful circuit card retainer that is adjustable to retain different sizes of circuit cards.

It is another object of the present invention to provide such a circuit card retainer which prevents the retained card from loosening by vibration.

It is an additional object of the present invention to provide such a circuit card retainer which is simple to install or remove from a computer cabinet or printed circuit card cage.

It is yet another object of the present invention to provide a new and useful circuit card retainer that is positionable to avoid interference with connectors or components attached to the circuit card.

It is still a further object of the present invention to provide a new and useful circuit card retainer that is easily attached to an existing circuit card connector.

SUMMARY OF THE INVENTION

There is provided, in accordance with the present invention, an adjustable height and position retainer for releasable retaining a printed circuit card in a circuit card edge connector. The retainer comprises an elongated base member for attachment to the side of a circuit card edge connector, an elongated retaining post, and a clamp assembly slideably attached to the retaining post and positionable at any selected position along the length of the retaining post. The retaining post attaches to the base member such that the post is secured in an orthogonal relationship with the circuit card edge connector and parallel with a circuit card installed into the edge connector yet the retaining post is positionable at various positions along the length of the base member. The clamp assembly includes an extrusion which holds the top edge of a printed circuit card installed into the circuit card edge connector.

In the described embodiment, the base member includes a channel formed along the length of said base, the channel having a dovetail cross-section, i.e., the channel having walls which are inclined so that the width of the channel is greater at the channel bottom than at the channel opening. The base is attached to the side of a circuit card edge connector by an adhesive strip with the channel opening away from the circuit card edge connector. The retaining post has a rectangular cross-section and includes an extrusion extending out from one side of the post near one end of the post. The extrusion is also has a dovetail shape thereby permitting slideable engagement of the extrusion within the channel.

The clamp assembly includes a rectangular opening equivalent in dimensions to the cross section of retainer post, the opening being centrally located in the body of the clamp and extending through the clamp body permitting the clamp to be placed over and situated at any position along the retainer post.

Teeth are formed into two opposing sides of the retaining post. The clamp assembly includes two moveable paws located on opposing sides of said clamp body, each one of said paws including teeth which are urged into engagement with the teeth along the sides of the retainer post in order to secure the position of the clamp on the post. Each paw also includes a lever arm which permits disengaged of the paw teeth from the teeth formed along the walls of the retainer post.

The above objects and other objects, features, and advantages of the present invention will become apparent from the following detailed specification when read in conjunction with the accompanying drawings in which applicable reference numerals have been carried forward.

DETAILED DESCRIPTION OF THE PREFERRED EMBODIMENT

Figure 1:
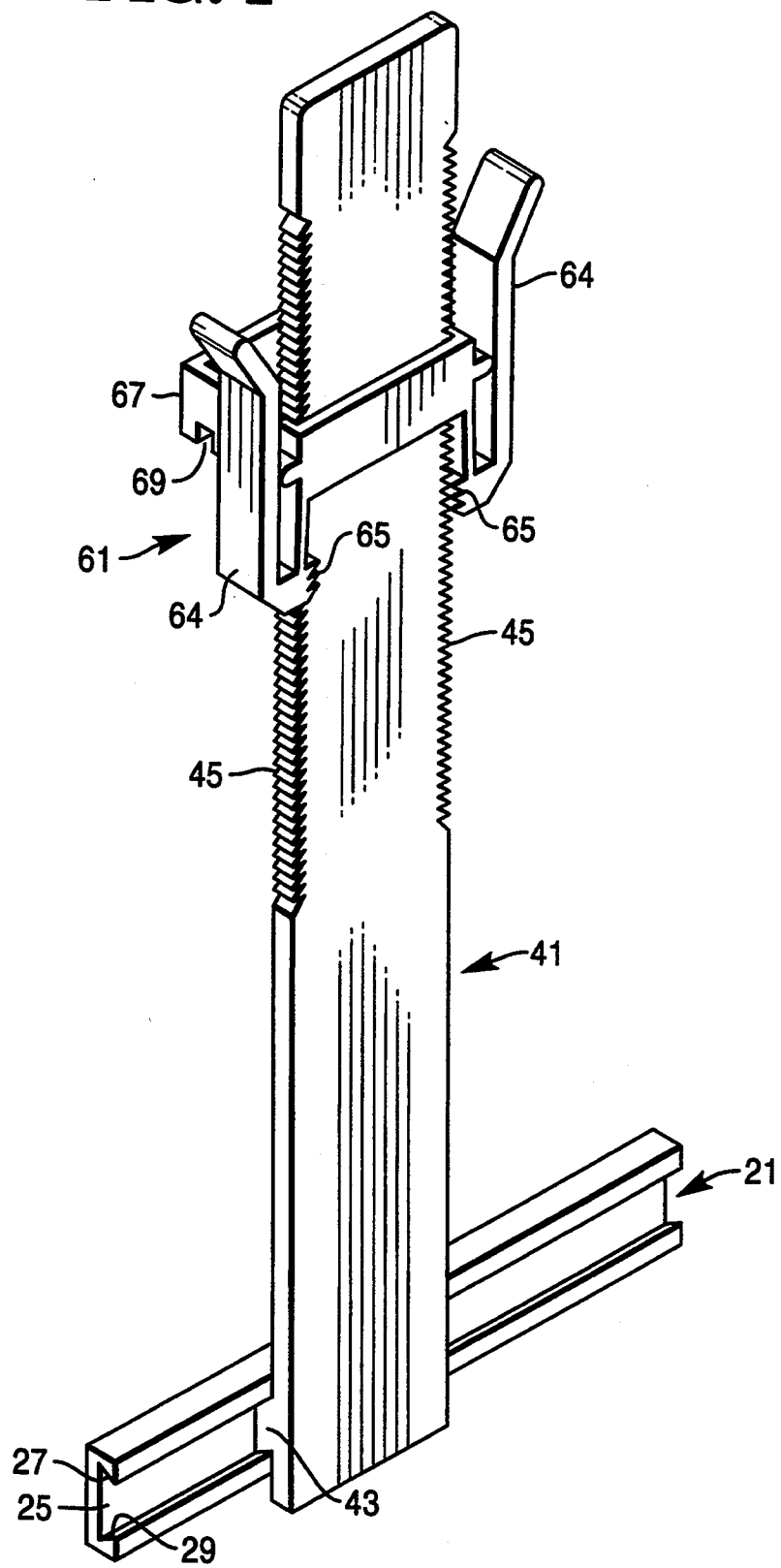
FIG. 1 is a perspective view of a preferred embodiment of a circuit card retainer constructed in accordance with the present invention.
Figure 2:
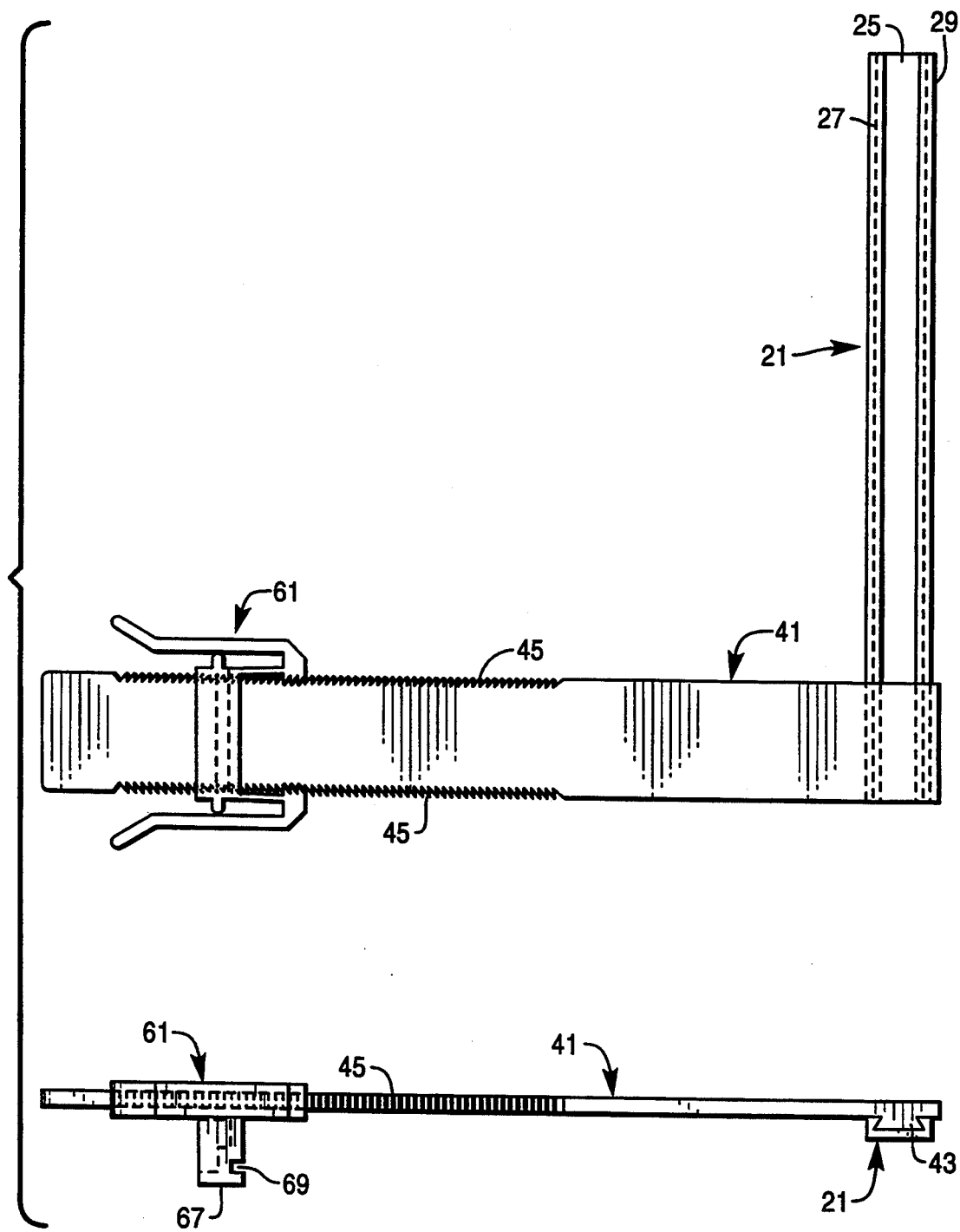
FIG. 2 provides a front and side view of the circuit card retainer shown in FIG. 1.

Referring now to FIG. 1, there is seen a perspective view of the novel circuit card retainer of the present invention. The preferred embodiment of the circuit card retainer consists of three molded plastic parts: a base member 21, a retainer post 41 and retainer catch 61. Additional front and side views of the circuit card retainer, with base 21, retainer post 41 and retainer catch 61 assembled, are provided in FIGS. 2 and 5.

The base member 21 is elongated with a generally rectangular cross-section. The height and length of base 21 are sized to be no greater than the height and length of a card edge connector. A dovetailed groove or channel 25 is formed lengthwise into the front of the base member. The walls of channel, identified by reference numerals 27 and 29, are inclined so that the width of the channel is greater at the channel bottom than at the channel opening in the front surface of the base. An adhesive backing, not shown, is applied to the back side of base 21 to allow attachment of the base to the side of a card edge connector 73, as shown in FIG. 5.

Figure 3:
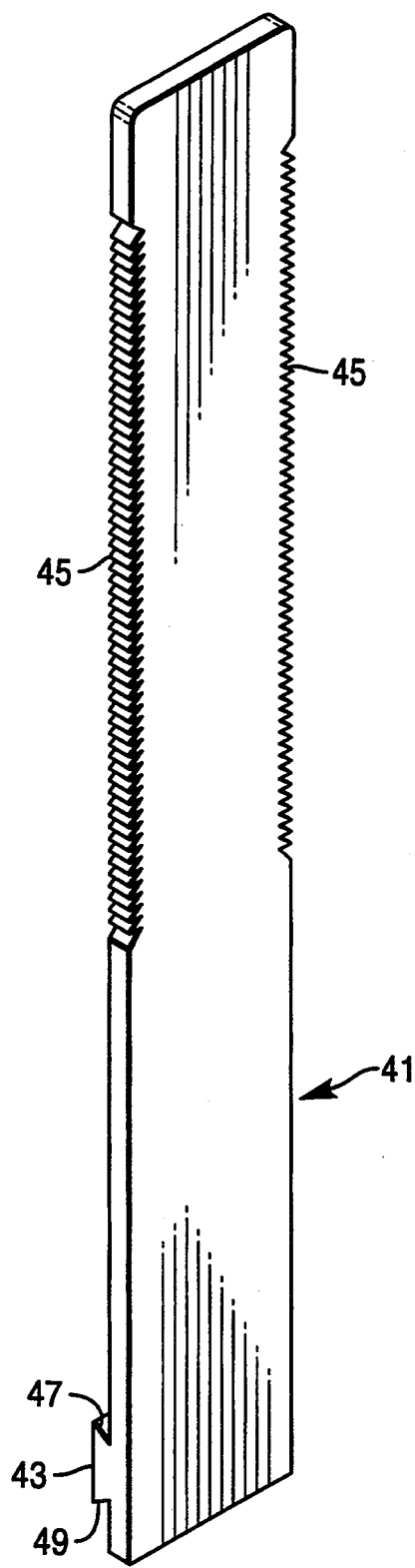
FIG. 3 is a perspective view of the retainer post 41 of the circuit card retainer of FIG. 1.

The retainer post 41, shown separate from base 21 and clamp 61 in FIG. 3, is seen to be elongated with a generally rectangular cross-section. The post is formed to have a length greater than the height of the largest printed circuit card which may be installed with the retainer. Saw-toothed sections 45 are provided along the top two-thirds of each of the narrow sides of the post. Near the base end of the retainer post, a dovetail shaped extrusion 43 is provided which extends from one of the wide sides of the post. The dovetail shaped extrusion is formed to be slideable engaged into channel 25 of base 21. When assembled together with base 21, retainer post 41 is held perpendicular with base 21, and accordingly perpendicular with the card edge connector to which base 21 is attached. The retainer post 41 can be positioned anywhere along channel 25.

Figure 4:
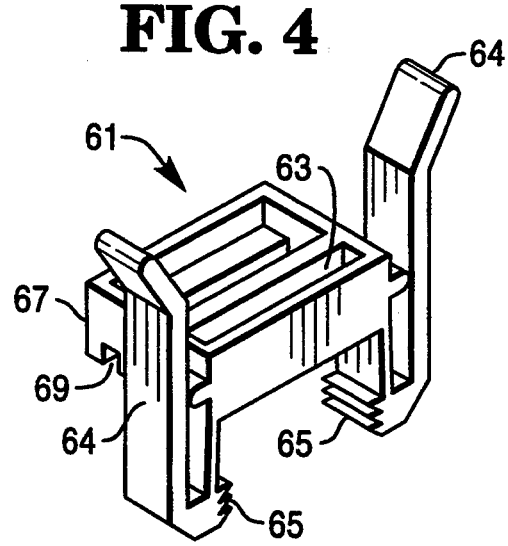
FIG. 4 provides a perspective view of the retaining catch 61 of the circuit card retainer of FIG. 1.

The retainer clamp 61 is shown in isolation in FIG. 4. The molded plastic clamp includes a rectangular opening 63, equivalent in dimensions to the cross section of retainer post 41, centrally located in the body of the clamp. The opening extends through the clamp body permitting the clamp to be placed over and situated at any position along retainer post 41. Located on opposing sides of the clamp body are two moveable paws 64. Each paw extends downward and includes slideably engaging teeth 65 formed into the lower, inner portion of the paw. With the clamp 61 placed onto post 41, the paws' teeth 65 are urged into engagement with the teeth 45 along the narrow edges of retainer post 41. Each paw also includes a lever arm which extends above the retainer clamp. The paws' teeth 65 can be disengaged from the teeth 45 along the narrow edges of post 41 by squeezing the paws' arms together, allowing the clamp to be moved up or down post 41. Extending out from a third side of the retainer body is an extended section 67. Extended section 67 includes a card receiving notch 69 formed into the bottom of the section for containing the top edge of a printed circuit card.

Figure 5:
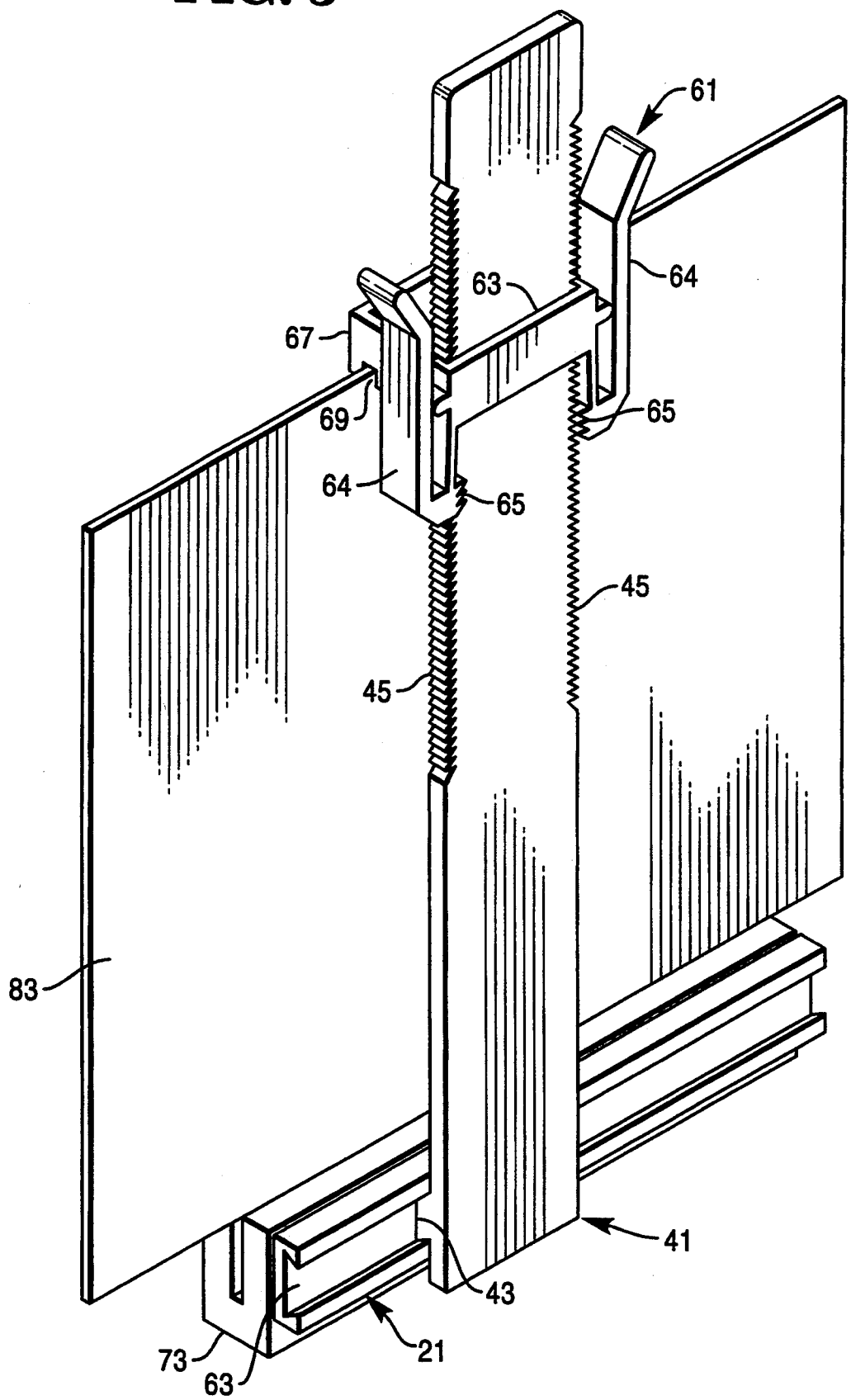
FIG. 5 is a perspective view of the circuit card retainer of FIG. 1, installed to retain an MCA printed circuit card within a circuit connector.

A perspective view of the assembled circuit card retainer, installed to retain a printed circuit card 83 within a circuit connector 73 is shown in FIG. 5. The circuit board card retainer described herein is employed by first positioning and attaching base 21 to one side of card edge connector 73. The base is secured to the side of connector 73 by an adhesive strip, not shown. Printed circuit card 83 is thereafter installed into connector 73 in the typical manner. Retainer post 41 may be assembled together with base 21 prior to attachment of the base to connector 73, following attachment, or after installation of the circuit card 83 into connector 73. The retainer clamp 61 is installed onto post 41, the extended section 67 overhanging the top edge of circuit card 73. The retainer clamp is lowered into contact with circuit card 73, the top edge of the circuit card being contained in receiving notch 69.

The printed circuit card can be removed from card edge connector by squeezing the clamp paw arms together to disengage the paws' teeth 65 frown the teeth 45 along the narrow edges of post 41 and lifting the clamp up from the top edge of printed circuit card 83. The card can then be removed from connector 73.

It can thus be seen that there has been provided by the present invention an improved circuit card retainer which prevents a retained printed circuit card from separating from its connector. The circuit card retainer is simple to install, being readily attached to an existing circuit card connector, or remove from a computer cabinet or printed circuit card cage. The retainer is positionable to avoid interference with connectors or components attached to the circuit card.

Although the presently preferred embodiment of the invention has been described, it will be understood that various changes may be made within the scope of the appended claims. For example, the retainer assembly could include circuit card connector 73, channel 25 being formed into side of the card edge connector. The means for engaging retainer post 41 with base 21, or the clamp 61 onto post 41, may be varied. A friction mechanism may be employed in place of slideable engaging teeth 65 and 45.

What is claimed is:

1. An adjustable retainer for releasable retaining a printed circuit card in a circuit card edge connector, said printed circuit card including a bottom edge for connection with said circuit card edge connector and a top edge opposite said bottom edge, said retainer comprising:

a base member for attachment to said circuit card edge connector;

an elongated retaining post having a length greater than the distance from said bottom edge to said top edge of said printed circuit board;

means for attaching said retaining post to said base member such that said retaining post is secured in an orthogonal relationship with said circuit card edge connector and parallel with said circuit card installed into said circuit card edge connector, said attachment means permitting attachment of said retaining post to said base member at various positions along a side of said circuit card edge connector;

a clamp assembly slideably attached to said retaining post and positionable at various positions along the length of said retaining post, said clamp assembly including a body and means for engaging the tog edge of said circuit card; and means for securing said clamp assembly into a selected position along said retainer post.

2. The printed circuit card retainer according to claim 1, wherein:

said base member is an elongated member including a channel formed therein, said base being attached along the side of said circuit card edge connector, said channel opening away from said circuit card edge connector; and said means for attaching said retaining post to said base member comprises an extrusion extending out from one side of said retaining post near one end of said retainer post, said extrusion and channel being formed to permit slideable engagement of said extrusion within said channel.

3. The printed circuit card retainer according to claim 2, wherein:

said channel having a first side wall, a second side wall, and a bottom wall and a dovetail cross-section, said channel side walls being inclined so that the width of the channel is greater at the channel bottom wall than at the channel opening; and said extrusion is dovetail shaped having side walls which are inclined so that the width of the extrusion increases away from said retainer post.

4. The printed circuit card retainer according to claim 1, wherein:

said elongated retaining post is of rectangular cross-section and includes teeth formed into two opposing sides of said retaining post;

said clamp assembly includes a rectangular opening equivalent in dimensions to the rectangular cross section of said retainer post, said rectangular opening being centrally located in the body of the clamp assembly and extending through the clamp assembly body permitting the clamp to be placed over and situated at any position along said retainer post; and said clamp assembly further including two moveable paws located on first and second opposing sides of said clamp assembly body, each one of said paws including teeth which are urged into engagement with the teeth along the sides of said retainer post, each one of said paws also including a lever arm which permits disengaged of the paw teeth from the teeth formed along the sides of said retainer post.

5. The printed circuit card retainer according to claim 4, wherein said means for engaging the top edge of said circuit card comprises:

an extended section extending out from a third side of the clamp assembly body, said extended section including a card receiving notch formed into a bottom surface of said extended section for containing the top edge of said printed circuit card.

6. The printed circuit card retainer according to claim 1, wherein:

said base member includes an adhesive strip for attaching said base member to the side of said circuit card edge connector.

7. An adjustable retainer for retaining a printed circuit card in a circuit card edge connector, said printed circuit card including a bottom edge for connection with said circuit card edge connector and a top edge opposite said bottom edge, said retainer comprising:

an elongated base member for attachment to said circuit card edge connector, said base member including a channel formed along a length of said base, said base member being attached along a side of said circuit card edge connector with said channel opening away from said circuit card edge connector;

an elongated retaining post, said post including an extrusion extending out from one side of said retaining post near a first end of said retainer post, said extrusion and channel being formed to permit slideable engagement of said extrusion within said channel, wherein said retaining post is secured in an orthogonal relationship with said circuit card edge connector and parallel with said circuit card installed into said circuit card edge connector, said extrusion and channel permitting attachment of said retaining post to said base member at various positions along the side of said circuit card edge connector; and a clamp assembly slideably attached to said retaining post for engaging the top edge of said circuit card and positionable at various positions along said retaining post, wherein said clamp assembly is capable of being secured into a selected position along said retainer post.

8. The printed circuit card retainer according to claim 7, wherein:

said elongated retaining post is of rectangular cross-section and includes teeth formed into two opposing sides of said retaining post;

said clamp assembly includes a rectangular opening equivalent in dimensions to the rectangular cross section of said retainer post, said rectangular opening extending through the clamp assembly permitting the clamp assembly to be placed over and situated at any position along said retainer post; and said clamp assembly further including two moveable paws located on first and second opposing sides of said clamp assembly, each one of said paws including teeth which are urged into engagement with the teeth along the sides of said retainer post, each one of said paws also including a lever arm which permits disengaged of the paw teeth from the teeth formed along the walls of said retainer post.

* * * * *